United States Patent [19]

Schaber

[11] Patent Number: 4,735,911

[45] Date of Patent: Apr. 5, 1988

[54] PROCESS FOR THE SIMULTANEOUS PRODUCTION OF BIPOLAR AND COMPLEMENTARY MOS TRANSISTORS ON A COMMON SILICON SUBSTRATE

[75] Inventor: Hans-Christian Schaber, Graefelfing, Fed. Rep. of Germany

[73] Assignee: Siemens Aktiengesellschaft, Berlin and Munich, Fed. Rep. of Germany

[21] Appl. No.: 931,641

[22] Filed: Nov. 17, 1986

[30] Foreign Application Priority Data

Dec. 17, 1985 [DE] Fed. Rep. of Germany ....... 3544638

[51] Int. Cl.⁴ .......................................... H01L 21/425
[52] U.S. Cl. ........................................ 437/33; 437/41; 437/57
[58] Field of Search ................ 29/571, 576 B, 576 E, 29/576 W, 577 C; 148/188; 357/33, 41, 57

[56] References Cited

U.S. PATENT DOCUMENTS

| | | | |
|---|---|---|---|
| 3,999,213 | 12/1976 | Brandt et al. | 148/DIG. 9 |
| 4,407,060 | 10/1983 | Sakurai | 148/188 X |
| 4,419,810 | 12/1983 | Riseman | 148/188 X |
| 4,486,942 | 12/1984 | Hirao | 29/571 |
| 4,536,945 | 8/1985 | Gray et al. | 29/577 C |
| 4,578,128 | 3/1986 | Mundt et al. | 29/576 W |
| 4,604,790 | 8/1986 | Bonn | 29/576 B |
| 4,613,885 | 9/1986 | Haken | 29/576 B |
| 4,637,124 | 1/1987 | Okuyama et al. | 29/577 C |
| 4,662,057 | 5/1987 | Yasuoka et al. | 29/576 B |

OTHER PUBLICATIONS

Miyamoto et al., International Electron Devices Meeting, Technical Digest, Dec. 5–7, 1983, Wn., D.C., pp. 63–66.

*Primary Examiner*—George T. Ozaki
*Attorney, Agent, or Firm*—Hill, Van Santen, Steadman & Simpson

[57] ABSTRACT

A process for the simultaneous production of bipolar transistors and complementary MOS transistors on a common silicon substrate wherein to accommodate the p-channel transistors, n-doped zones are produced in a p-doped substrate and npn bipolar transistors are provided in the n-doped zones where the n-zones form the collector of the transistor and the n-zones are superimposed over n+-doped zones. The latter are connected in the bipolar transistor zone by deeply extending collector terminals. The use of sidewall insulation on the p+- and n+-conducting structures composed of polysilicon or a silicide which are used for diffusing-out source/drain zones and base-emitter zones permit the formation of shorter channel lengths. The process is used to produce VLSI circuits which have high switching speeds.

7 Claims, 2 Drawing Sheets

PROCESS FOR THE SIMULTANEOUS PRODUCTION OF BIPOLAR AND COMPLEMENTARY MOS TRANSISTORS ON A COMMON SILICON SUBSTRATE

BACKGROUND OF THE INVENTION

1. Field of the Invention

The present invention relates to a process for the simultaneous production of bipolar and complementary MOS transistors on a common substrate which involves providing n-doped zones in a p-doped silicon substrate together with insulated npn bipolar transistors, where the n-doped zones form the collector of the transistor and the n-zones are superimposed over buried n+-doped zones which are connected in the bipolar transistor zones by deeply extending collector terminals.

2. Description of the Prior Art

A process for forming 1.0 micron well CMOS bipolar transistors for highly integrated circuits is disclosed, for example, in an article by Miyamoto et al in the IEDM 1983, Technical Digest (December 1983), pages 63 to 66. In order to reduce the collector resistance, a buried collector is used which is connected by means of a deep collector contact.

The production of bipolar transistors having a buried collector and self-aligned base-emitter zones wherein the emitter and base zones are formed by diffusing-out of doped polysilicon structures is disclosed in an article by H. Murrmann entitled "Modern Bipolar Technology for High Performance ICs" in the Siemens Research and Development Reports, Vol. 5 (1976), No. 6, pages 353 to 359 and in an article by A. Wieder entitled "Self-Aligned Bipolar Technology—New Chances For Very High Speed Digital Integrated Circuits" in the Siemans Research and Development Reports, Vol. 13 (1984) on pages 246 to 252. Transistors of this kind are used in LSI circuits for high switching speeds.

SUMMARY OF THE INVENTION

The present invention seeks to provide a process for the manufacture of highly integrated circuits containing complementary MOS (CMOS) transistors and bipolar transistors which permit the highest possible system speeds. CMOS transistors having short channel lengths are produced simultaneously with, and compatibly with, self-aligned bipolar transistors, the latter being particularly advantageous for very high switching speeds. The process makes use of the double-polysilicon technology as described in the aforementioned article by A. Wieder.

The object of the present invention is accomplished by a process of the type described which is characterized by the following sequence of process steps in the order given:

(a) the production of buried n+- doped zones in a p-doped substrate by implementation of n-doping ions after previous masking of the other zones, (b) application of a p- or n-doped epitaxial layer to the entire surface, (c) application of a double layer composed of silicon oxide and silicon nitride, and structuring of the silicon nitride for the succeeding local oxidation (LOCOS), (d) production of a field oxide, required to separate the active transistor zones in the substrate, by local oxidation following the removal of the photo-resist mask and using the silicon nitride structure as an oxidation mask, (e) production of the n-zones and p-zones in the substrate by implantation of n- and p-doping ions and production of the zones for deep reaching collector terminals by deep implementation using n-doping ions and diffusing the ions in, (f) removal of the nitride/oxide mask, (g) deposition of a boron-doped layer consisting of polysilicon, a refractory metal silicide, or a double layer of polysilicon and metal silicide to the entire surface, (h) deposition of a first insulating layer onto the entire surface, (i) utilizing a photo-resist technique and structuring the two layers with vertical sidewalls until the substrate is exposed, using a dry etching procedure to define the base zone of the bipolar transistors and the source/drain zones of the p-channel transistors, (j) using a photo-resist technique to produce the active base zone by boron-ion implantation, (k) deposition of a second insulating layer which provides a good edge cover of the structures of the p+-conducting layer and the first insulating layer, (l) using an anisotropic etching process to produce lateral insulating strips from the second insulating layer at the sidewalls of the p+- conducting structures, (m) depositing an n+- conducting layer consisting of polysilicon, refractory metal silicide or a double layer of polysilicon and metal silicide over the entire surface, (n) utilizing a photo-resist technique and structuring the n+-conducting layer in such a manner that the source/drain terminals of the n-channel transistors and the emitter and collector termianl of the bipolar transistors are formed on the substrate, (o) use of a high temperature step so that the free silicon or silicide surfaces are provided with an oxide layer which differs in thickness depending on the doping and that the emitter zone of the bipolar transistors are formed by diffusing out of the p+- and n+-conducting structures respectively, (p) etching free the gate zones of the MOS transistors wherein the thickness of the oxide strips located at the sidewalls of the p+- and n+-conducting structures is determined in accordance with the desired gate lengths of the MOS transistors, (q) growth of a gate oxide, (r) carrying out channel implementation using boron ions over the entire surface, (s) depositing, doping and structuring the respective gate electrodes, (t) producing an intermediate layer which serves as an insulating oxide, opening the contact holes to the terminals consisting of the p+- and n+-conducting structures, of the active transistor zones and completing the metallization procedure.

The process of the present invention uses process sequences which are known for self-aligned bipolar transistors, and combines and supplements them to permit a simultaneous and advantageous production of p-channel and n-channel MOS transistors, resulting in the following advantages:

(1) The production of extremely high-speed, self-aligned bipolar transistors in double poly-silicon technology as described in the aforementioned article by A. Wieder is possible.

(2) The channel lengths of the CMOS transistors can be substantially shorter than the minimum structure of the lithography which is used, so that even with conventional optical lithography channel lengths below 0.5 micron can be obtained.

(3) The source and drain zones of the CMOS transistors can be contacted in self-aligning and low ohmic fashion due to the use of the silicide and polycide (i.e., a double layer of polysilicon and silicide) layers.

(4) The process of the present invention provides the possibility of producing extremely high-speed and highly integrated circuits in which the lighography employed is subject to relative relaxed requirements.

BRIEF DESCRIPTION OF THE DRAWINGS

The process sequence of the present invention will be described in further detail with reference to FIGS. 1 to 5 which constitute an exemplary embodiment. The Figures represent fragmentary sectional diagrams of only those process steps which are essential to the invention, with the same reference symbols being provided for similar components.

DESCRIPTION OF THE PREFERRED EMBODIMENTS

Figure 1:
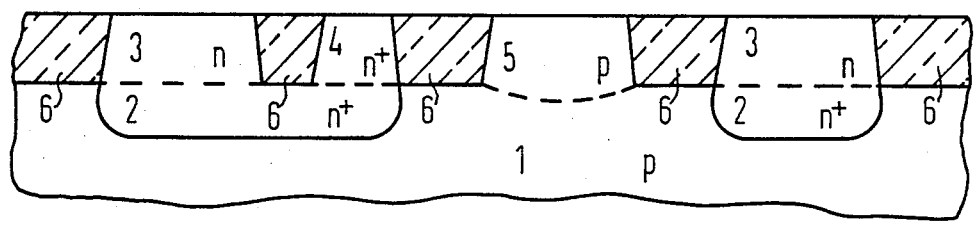

In FIG. 1 there is shown the formation of a buried collector zone 2 in a p-doped silicon substrate 1 by masked ion implantation of antimony in a dosage of $3\times 10^{15}$ cm$^{-2}$ and an energy level of 80 keV. Over the surface there is deposited an n-doped epitaxial layer 3. Next, a double layer consisting of silicon oxide and silicon nitride is deposited with appropriate structuring of the silicon nitride layer for the subsequent LOCOS step. The local oxidation produces field oxide regions 6 which are required to separate the active transistor zones A, B, and C (shown in FIG. 5) in the substrate 1 using the silicon nitride structure produced in the previous step as an oxidation mask.

P-zone wells 3 are produced by masked boron ion implantation at a dosage of $5\times 10^{12}$ cm$^{-2}$ and an energy level of 180 keV. Also, zones for the deep reaching collector terminal are produced by deep implantation of phosphorus ions at a dosage of $3\times 10^{15}$ cm$^{-2}$ and at an energy level of 80 keV, coupled with diffusing-in, whereby the collector zone 4 is driven inwards to the collector zone 2. This is followed by removal of the nitride/oxide mask.

Figure 5:
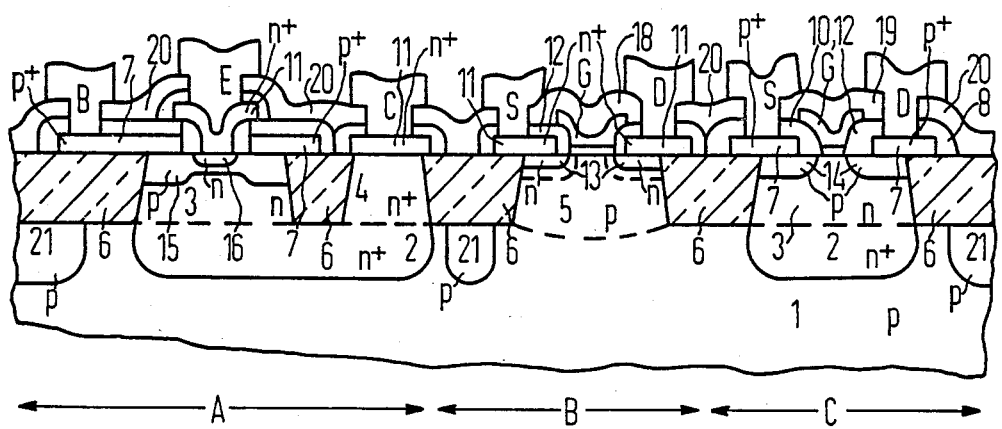

If necessary, the so-called channel-stop zones 21 can also be produced beneath the field oxide zones by boron ion implantation, as shown in FIG. 5.

Figure 2:
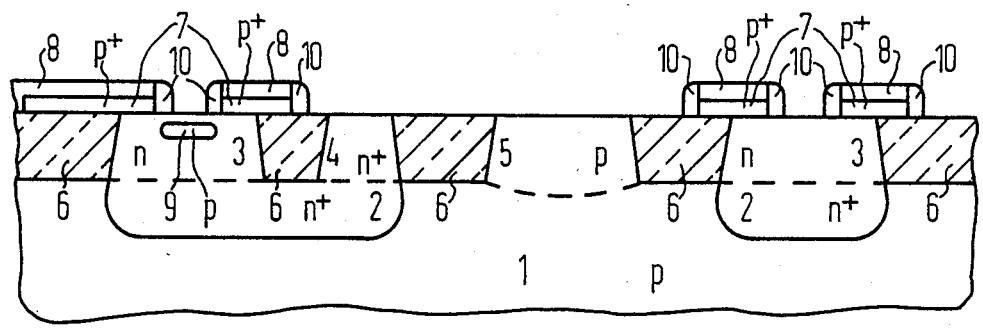

In FIG. 2, there are shown p$^+$-layer structures 7 preferably consisting of boron-doped polysilicon with overlying insulating layers 8 preferably consisting of SiO$_2$. The two layers are applied to the entire surface and are structure with vertical sidewalls using a photoresist technique and a dry etching procedure, for example, reactive ion etching in a trifluoromethane/oxygen gas mixture in order to remove the insulating layers 8. This may be followed by plasma etching in carbon tetrachloride-helium in order to structure the layers 7. The layers 7 which are directly arranged on the substrate surface serve to determine the base zone of the bipolar transistors A and the source/drain zones and terminals of the p-channel transistors C. The p-conducting layer structures 7 which can also consist of a silicide or polycide, where the boron doping can be carried out during and also following deposition, serves as a diffusion source during the production of the base zone and the source/drain zones of the p-channel transistor C.

Following the pattering structure of the double layer 7, 8 with the vertical sidewalls during which the substrate is etched as little as possible (less than 50 nm) and after a photo-resist masking step has been carried out, the active base zone 9 is implanted with boron ions. Finally, an insulating layer which provides a good edge cover and which preferably consists of SiO$_2$ is applied to the entire surafce and is structured by anisotropic etching, for example, reactive ion etching in a trifluoromethane-oxygen gas mixture in such a manner that the lateral insulating strips 10 remain only at the sidewalls of the p-conducting layer structures 7.

Figure 3:
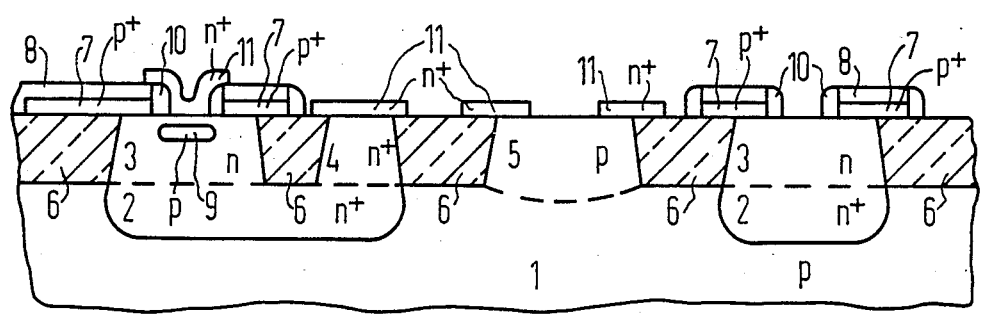

In FIG. 3, there is shown an n$^+$- conducting layer 11 consisting of polysilicon which is deposited on the entire surface and contains a relatively high arsenic doping (greater than $10^{20}$ cm$^{-3}$) introduced preferably during chemical vapor deposition of the layer. This is necessary to achieve as abrupt as possible a reduction in the arsenic concentration at the boundary surface to the substrate. The doped polysilicon layer 11 can be reinforced by a refracting metal silicon layer which results in terminals which are as highly conducting as possible for later contacting. By means of masked, additional phosphorus implantation into the layer 11, a soft pn-junction in the drain zone can be produced in the zones of the n-channel transistors B (not shown in the drawing).

Using photo-lithography, the arsenic-doped layer 11 is structured in such a manner that the source/drain terminals of the n-channel transistor and the emitter and collector terminals of the bipolar transistor A are formed on the substrate 1. Vertical sidewalls as described with reference to FIG. 2 are not necessary in this instance; however, again the substrate should be etched as little as possible.

Figure 4:
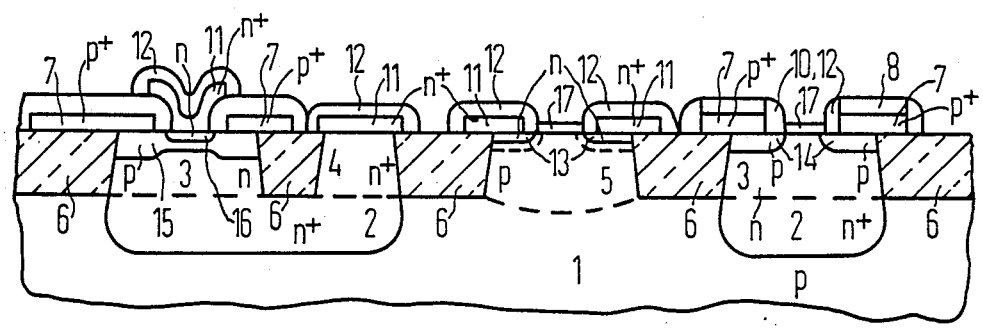

Turning to FIG. 4, a selective oxidation of the polysilicon or silicide surface layer 11 is now carried out, preferably in a moist atmosphere and under high pressure, for example, in the region of 10 bars at 900° to 950° C. During this oxidation, in which the oxide on the n$^+$-zones grows noticeably thicker (approximately by a factor of 3) than on the n- or p-doped zones, the oxide layer 12 which provides the sidewall insulation is formed. In addition, the zones of emitter 16, base terminal 15 and source/drain 13, 14 located in the substrate 1, 3, 5 are produced by outward diffusion from the p$^+$- and n$^+$-doped layer structures 7, 11. Then the gate zones of the MS transistors B and C are freed of the thin oxide which has grown during the selective oxidation. The width of the insulating strips 10, 12 at the sidewalls of the doped structures 7, 11 is determined by specially selected etching procedures either isotropic or anisotropic. The width determines the gate length and thus the channel length of the CMOS transistors. Dry etching procedure such as reactive ion etching, for example, in a trifluoromethane/oxygen gas mixture or wet chemical etching (isotropic) can be used as etching procedures. Then the gate oxide 17 is formed in a predetermined layer thickness of approximately 25 nm.

FIG. 5 shows a complete arrangement with metallization following the channel implantation, deposition, possibly doping, and structuring of the gate electrodes 18, 19 after previous masking of the other zones. It also illustrates the structure after production of an intermediate layer 20 which serves as an insulating oxide, opening of the contact holes to the terminals which consist of the p$^+$- and n$^+$-conducting structures 7, 11 to the base zone B, emitter zone E, collector zone C, and the source/drain terminals (S/D) and the gate electrodes G. These last-named steps are standard known procedures.

FIG. 5 also shows the channel stop-zones 21 which have been referred to in connection with FIG. 1 and which are produced beneath the field oxide zones 6. The function of the channel-stop zones 21 is to provide a reliable insulation between adjacent collector zones by increasing the threshold voltage of the parasitic thick oxide transistor to values above the maximum operating voltage.

It should be evident that various modifications can be made to the described embodiments without departing from the scope of the present invention.

I claim as my invention:

1. A process for the simultaneous production of bipolar and complementary MOS transistors on a common p-doped silicon substrate which comprises the following steps in sequence:
    (a) implanting n-doping ions in said p-doped substrate to form buried n+-doped zones in the regions where bipolar or p-channel MOS transistors are to be formed,
    (b) applying a doped epitaxial layer to the entire surface,
    (c) applying and patterning a double layer of silicon oxide and silicon nitride over said epitaxial layer whereby the silicon nitride layer overlies the silicon oxide layer,
    (d) locally oxidizing the resulting surface using said silicon nitride as an oxidation mask to produce field oxide zones,
    (e) implanting and diffusing-in n-zones and p-zones as well as n+-zones for deep collector terminals in said substrate,
    (f) removing said double layer of silicon oxide and silicon nitride,
    (g) depositing a boron-doped layer of a material selected from the group consisting of polysilicon, refractory metal silicide and a double layer of polysilicon and metal silicide over the entire surface,
    (h) depositing a first insulating layer over the entire surface,
    (i) structuring said boron-doped layer and said first insulating layer by dry etching to form vertical sidewalls therein while exposing the substrate to define the base zone of bipolar transistors and source/drain zones of p-channel transistors,
    (j) implanting boron ions to produce an active base in said substrate,
    (k) depositing a second insulating layer over the entire surface,
    (l) etching the surface anisotropically to produce lateral insulating strips from said second insulating layer at the sidewalls of the p+-conducting layer structures,
    (m) depositing an n+-conducting layer of a material selected from the group consisting of polysilicon, refractory metal silicide and a double layer of polysilicon and refractory metal silicide over the entire surface,
    (n) structuring the n+-conducting layer to form source/drain terminals of n-channel transistors and the emitter and collector terminals of bipolar transistors on the substrate,
    (o) oxidizing the free silicon or silicide surfaces to provide an oxide layer, while diffusing source/drain zones of the MOS transistors and the base and emitter zones of the bipolar transistors from the p+- and n+-conducting zones,
    (p) etching away the gate zones of the MOS transistors while providing a thickness of oxide strips at the sidewalls of the p+- and n+-conducting structures in accordance with the desired gate lengths of the MOS transistors,
    (q) growing a gate oxide between said sidewalls,
    (r) implanting boron ions over the entire surface,
    (s) depositing, doping and structuring gate electrodes at the gate zones and
    (t) applying electrodes to the active transistor zones thus produces.

2. A process according to claim 1 wherein said first and second insulating layers consist of $SiO_2$.

3. A process according to claim 1 wherein during the depositing of the n+- conducting layer of step (m) said layer is doped with arsenic at a concentration greater than $10^{20}$ cm$^{-3}$.

4. A process according to claim 1 wherein between steps (m) and (n), phosphorus ions are implanted in the region of the n-channel transistors.

5. A process according to claim 1 wherein the high temperature treatment according to step (o) is carried out in a moist atmosphere at high pressure.

6. A process according to claim 1 which comprises silicon deep etching in the field oxide zones after step (c) to produce a planar surface.

7. A process according to claim 1 which includes the step of implanting boron ions to produce channel-stop zones beneath the field oxide zones prior to step (d).

* * * * *